(12) United States Patent
Fan (10) Patent No.: US 7,132,301 B1
(45) Date of Patent: Nov. 7, 2006

(54) METHOD AND APPARATUS FOR REVIEWING VOLTAGE CONTRAST DEFECTS IN SEMICONDUCTOR WAFERS

(75) Inventor: Frank Y. H. Fan, Pleasanton, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 457 days.

(21) Appl. No.: 10/600,500

(22) Filed: Jun. 19, 2003

(51) Int. Cl.
*H01L 21/00* (2006.01)
(52) U.S. Cl. .......................................... 438/7; 250/306
(58) Field of Classification Search ................ 205/306; 324/751; 438/7
See application file for complete search history.

(56) References Cited

U.S. PATENT DOCUMENTS

| | | | |
|---|---|---|---|
| 6,232,787 B1 * | 5/2001 | Lo et al. ..................... | 324/751 |
| 6,566,897 B1 * | 5/2003 | Lo et al. ..................... | 324/751 |
| 6,627,884 B1 * | 9/2003 | McCord et al. ............. | 250/306 |

OTHER PUBLICATIONS

K. Nakamae, H. Tanimoto, T. Takase, H. Fujioka and K. Ura. [Journal of Physics D-Applied physics, 1992, V25, N12, (Dec. 14), p. 1681-1686.]"Electron Beam Assisted High Aspect Ratio, Submicrometer Etching of passivation SiO2 on Large Scale Integra".*

* cited by examiner

*Primary Examiner*—Michael Lebentritt
*Assistant Examiner*—Andre' C. Stevenson
(74) *Attorney, Agent, or Firm*—Beyer Weaver & Thomas LLP (57) ABSTRACT

Techniques for identifying, locating, detecting, and reviewing voltage contrast defects are described. A system for implementing the present invention includes a charged particle beam defect review system with one or more installed electron flood guns. In order to review a semiconductor specimen, an entire semiconductor wafer or a sub-region of a wafer is flooded with electrons from the flood gun(s) so that the wafer surface is charged to a certain voltage level. Flooding the specimen greatly enhances the effect of voltage contrast review techniques and therefore manifests voltage contrast defects that would not appear otherwise. The inventive techniques can also be applied so that a review system can be used to inspect at least a portion of a semiconductor wafer. Techniques for controlling the amount of negative charge applied to the specimen are also described.

16 Claims, 4 Drawing Sheets

METHOD AND APPARATUS FOR REVIEWING VOLTAGE CONTRAST DEFECTS IN SEMICONDUCTOR WAFERS

FIELD OF THE INVENTION

The present invention relates generally to semiconductor inspection and review processes, and more specifically to voltage contrast review techniques.

BACKGROUND OF THE INVENTION

The manufacture of integrated circuit devices involves intricate processes for creating circuit patterns on semiconductor wafers. Along with the highly developed technologies used to manufacture the integrated circuitry, highly developed testing processes are also necessary. The extremely small scale at which the circuitry is created demands such testing techniques in order to detect electrical failures earlier in fabrication processes. This is increasingly important to shorten product development cycles and to increase product yield and productivity.

Test processes for semiconductor manufacturing involves inspection and review stages. First, a semiconductor wafer can be inspected with an electron beam inspection system that detects electrical failures, for example as voltage contrast defects. The inspection process involves a high level scan of a wafer to identify and locate potential defects. Then, after the potential defects are located, a review process is conducted. The review process involves a much more detailed examination of individual potential defects. Through the review process, additional information regarding each potential defect can be obtained. For instance, the size, shape, general nature, and cause of a defect can be determined.

Typically, scanning electron microscopes (SEM) used for review processes are set to emit an electron beam at a much lower current level than that used by SEM inspection systems. For example, a typical SEM inspection tool generates an electron beam in the range of 20 to 200 nano-Amps and a typical SEM review system generates an electron beam in the range of 10 to 50 pico-Amps. The lower beam current allows the SEM review system to obtain higher resolution data. However, this also makes it more difficult to locate the voltage contrast defects found by the inspection system. The low beam current cannot provide the sufficient charge required for the voltage contrast defects to manifest themselves for review. Unfortunately, the inability to locate a voltage contrast defect during the review process eliminates any possibility of reviewing the defect and gaining any additional information about particular manufacturing processes.

In view of the foregoing, semiconductor review process that can more effectively locate and review voltage contrast defects at high resolution levels would be desirable.

BRIEF SUMMARY OF THE INVENTION

The present invention is directed to new techniques for identifying, locating, detecting, and reviewing voltage contrast (VC) defects. The techniques improve capabilities to detect voltage contrast defects and then obtain high-resolution images of such defects. A system for implementing the present invention includes a charged particle beam defect review system with one or more installed electron flood guns. Before defect review is performed, an entire semiconductor wafer or a sub-region of a wafer is flooded with electrons so that the wafer surface is charged to a certain voltage level. The charge of the wafer surface can also be optionally controlled. Flooding the specimen greatly enhances the effect of voltage contrast review techniques and therefore manifests voltage contrast defects that would not appear otherwise. Then the location of the VC defects can be readily identified and further work such as review, energy dispersive x-ray (EDX), and Focus Ion Beam (FIB) cross-sectioning can be performed.

One aspect of the present invention is directed towards a method for reviewing voltage contrast defects on a semiconductor specimen. This method involves turning on an electron flood gun, using an electron beam generator to direct an electron beam upon the surface of the specimen, wherein the electron beam causes secondary electrons to emanate from the specimen, detecting the secondary electrons in order to locate voltage contrast defects, and reviewing the located voltage contrast defects. In an alternative embodiment, this method also involves an electrode that is charged with a positive or a negative bias in order to maintain a desired charge on the surface of the semiconductor specimen. In yet another alternative embodiment, this method also involves biasing a specimen stage at a certain voltage level in order to maintain a desired charge amount on the surface of the semiconductor specimen.

Yet another aspect of the present invention pertains to a charged particle beam system for use in reviewing a semiconductor wafer. The system includes at least an electron beam generator that generates and directs an electron beam towards the semiconductor wafer, an electron beam column through which the electron beam travels towards the semiconductor wafer, a sample stage that secures and supports the semiconductor wafer, and at least one charge depositing device for adding a desired amount of bias to a surface of the semiconductor wafer. In an alternative embodiment, the system also includes a stage bias regulator that is attached to the sample stage, which is used to regulate the voltage bias of the stage, whereby regulating the bias of the stage can assist in obtaining a desired surface charge on the semiconductor wafer. In another alternative embodiment, the system also includes a bias regulating electrode that is positioned above the semiconductor wafer, the voltage of the bias regulating electrode being controlled in order to obtain a desired surface charge on the semiconductor wafer.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

In this invention, new techniques are used to identify, locate, detect, and review voltage contrast (VC) defects of interest. One or more electron flood guns are installed on charged particle beam defect review systems (e.g., a scanning electron microscope (SEM)) in order to implement the techniques. Before defect review is performed, an area surrounding the defect location, a die area, a part of the wafer, or the full wafer is flooded with electrons so that the wafer surface is charged to a certain voltage level. Flooding the specimen greatly enhances the effect of voltage contrast and therefore manifests voltage contrast defects that will not appear otherwise. Then the location of the VC defects can be readily identified and further work such as review, energy dispersive x-ray (EDX), and Focus Ion Beam (FIB) cross-sectioning can be performed.

A description of a charged particle beam system that can be used to implement the present invention will first be described in FIG. 1. In most embodiments, the charged particle beam systems will be systems used for reviewing features on a semiconductor wafer. As mentioned earlier, review systems typically utilize electron beams having lower beam current levels. In one embodiment, the charged particle beam system can be a scanning electron microscope (SEM).

Figure 1:
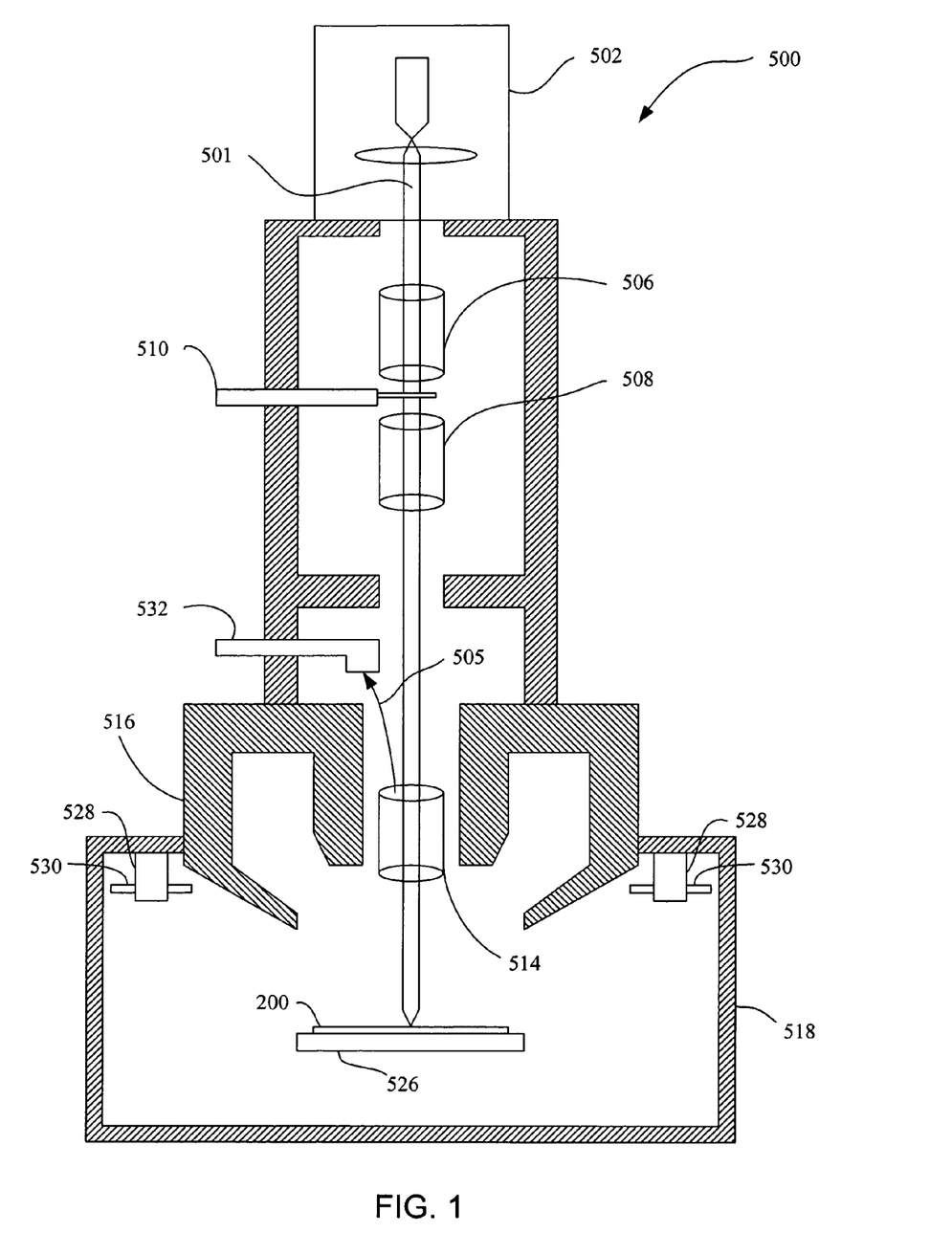
FIG. 1 illustrates a diagrammatic representation of a scanning electron microscope in accordance with one embodiment of the present invention.

FIG. 1 illustrates a diagrammatic representation of a scanning electron microscope (SEM) 500 in accordance with one embodiment of the present invention. As shown, SEM system 500 includes an electron beam generator (502 through 516) that generates and directs an electron beam 501 substantially toward an area of interest on a specimen 200, which is supported by a stage 526. Specimen 200 and stage 526 are enclosed within a vacuum chamber 518.

Electron flood guns 528 are positioned above specimen 200. Electron flood guns 528 are devices capable of directing an electron beam towards and applying electrons onto specimen 200, which can be a semiconductor wafer. The amount of charge on the wafer can be controlled using flood guns 528. The amount of charge on specimen 200 can be obtained with further assistance of an optional sample charge electrode 530. The optional specimen charge electrode 530 is positioned above specimen 200. Specimen charge electrode 530 can be maintained at a certain bias level in order to regulate the amount of charge on the surface of specimen 200. Specimen charge electrode 530 can be what is commonly referred to as a Wehnelt electrode. A biased sample stage 526 can also be used together with flood guns 528 to obtain the surface charge of specimen 200.

System 500 can operate to apply a negative or a positive charge on specimen 200 depending upon the types of voltage contrast defects desired to be reviewed. A negative charge is applied by flooding specimen 200 with electrons. Two optional and additional techniques can be used to obtain and regulate the amount of negative charge on specimen 200. First, specimen charge electrodes 530, which are located above specimen 200 are negatively biased such that secondary electrons generated during flooding with flood guns 528 are forced to remain on specimen 200. Or secondly, stage 526 can be positively biased so that secondary electrons generated during flooding are "held" onto specimen 200 from below. A positive charge is produced on specimen 200 by positively biasing specimen charge electrodes 530 or negatively biasing stage 526. In this manner, electrons are forced away from specimen 200 to leave a positively charged specimen. Ideally, a desired charge is applied to sample 200 quickly and uniformly such that an even amount of charge is applied over sample 200.

Even though two flood guns 528 are illustrated in FIG. 1, one or more flood guns can be used depending upon specific review system parameters. Operating flood guns 528 involves supplying power to flood guns 528, emitting electrons, and moving the wafer under flood guns 528 to charge up the surface of wafer 200. Optionally, biasing electrode 530 or stage 526 can also be performed in order to obtain a desired charge on the surface of the semiconductor wafer.

Each electron flood gun 528 may have a spot size in the range of approximately 1–2 cm and generate an electron beam in the range of approximately 0–10 milli Amps. Electron flood guns typically are more powerful and have a larger spot size than electron beams of conventional review systems in order to efficiently apply a large surface charge to a specimen such as a semiconductor wafer. Flood guns 530 can apply a charge to an entire surface of a semiconductor wafer or a sub-region. The landing energy and emission current of the flood gun's electron beam can be adjusted to apply an appropriate charge level to specimen 200. For example, a high amount of charge is applied to wafers having voltage contrast defects that are more difficult to detect. An example of defects that are hard to detect include high aspect ratio contacts and vias (these are very tall and thin). In one implementation, a high negative charge is applied to these features so that secondary electrons will have sufficient energy to escape from the features and reach an electron detector. In the opposite situation, less negative charge is required for wafers having easier to detect features such as lower aspect ratio contacts or vias. Manifesting voltage contrast defects by applying a certain amount of surface charge allows the review system to detect and then review defects.

SEM system 500 also includes at least one detector 532 arranged to detect charged particles 205 such as secondary electrons and/or backscattered electrons that emanate from sample 200. SEM system 500 may also detect X-rays emitted from specimen 200. Detector 532 may take the form of a micro-channel plate, micro-sphere plate, semiconductor diode, a scintillator/photomultiplier (PMT) assembly, an Energy Dispersive System (EDS), or a wavelength dispersive system (WDS) detector.

Electron beam generator (502 through 516) may be arranged in any suitable configuration for generating an electron beam that will reach specimen 200 and result in secondary electrons being emitted from the sample 200. In one embodiment, the electron beam generator can include an electron source unit 502, an alignment octopole 506, an electrostatic predeflector 508, a variable aperture 510, a Wien filter 514, and a magnetic objective lens 516. The source unit 502 may be implemented in any suitable form for generating and emitting electrons. For example, the source unit 502 may be in the form of a filament that is heated such that electrons within the filament are excited and emitted from the filament. Typical review SEM electron beams are generated at relative low current levels in order to achieve high resolution review. For instance, review SEM electron beams can be generated in the current range of 10–50 picoAmps. Typical electron beam spot sizes range from 2–20 nm.

Octupole 506 is configured to align the beam after a particular gun lens voltage is selected. In other words, the beam may have to be moved such that it is realigned with respect to the aperture 510. Aperture 510 forms a hole through which the beam is directed. The lower quadrupole 508 may be included to compensate for mechanical alignment discrepancies. That is, the lower quadrupole 508 is used to adjust the alignment of the beam with respect to any misaligned through-holes of the SEM through which the beam must travel.

Wien filter 514 provides a B×E field (e.g., a magnetic field's direction is perpendicular and directed away from a direction of an electric field) that is normal to the path of the electron beam. The Wien filter 514 applies an E force on the beam that is opposite to the B force that is applied on the beam. Thus, the Wien filter does not substantially move the primary beam off axis. However, the Wien filter 514 applies the E force and B force on secondary electrons emitted from the sample in a same direction that is towards the detector 532. Thus, the Wien filter 514 deflects secondary electrons towards the detector 532. The Wien filter 514 and/or octopole 506 and/or quadrapole 508 may be configured to direct the beam across an area of the sample. By setting the X and Y scan voltages, a particular beam pattern may be selected. The deflection system may include a processor that may be also configured to control voltage settings on the electrodes, as well as scan voltages, as a function of incident beam position.

Magnetic objective lens 516 provides a mechanism for fine focusing of the beam on the sample. A plurality of electrostatic lens (not shown) may provide fast focus of the beam onto the sample surface. The SEM system 500 may include a support or stage (not shown) for supporting the sample 200.

SEM system 500 may also include an image generator (not shown) arranged to receive the detected signal and generate and/or store an image. The image generator is operable to generate an image based on the detected signal. Thus, the SEM system 500 may also include an analog to digital converter for converting the detected signal into a digital signal. The SEM system 500 may also include a computer system for processing the image frame data to generate an image of the sample. For example, successive image frame data may be averaged together to create the image.

The techniques of the present invention can be implemented on any defect review system based on SEM technology. In some implementations of the invention, SEM system 500 can also be substituted with a charged particle system such as a Focused Ion Beam system.

System 500 can be arranged to review semiconductor wafers inline or offline with semiconductor manufacturing processes. Inline techniques refer to review that takes place immediately after each manufacturing process stage. Economy of time and resources can be achieved with inline techniques since defects can be located and reviewed before completion of the manufacturing processes.

Figure 2:
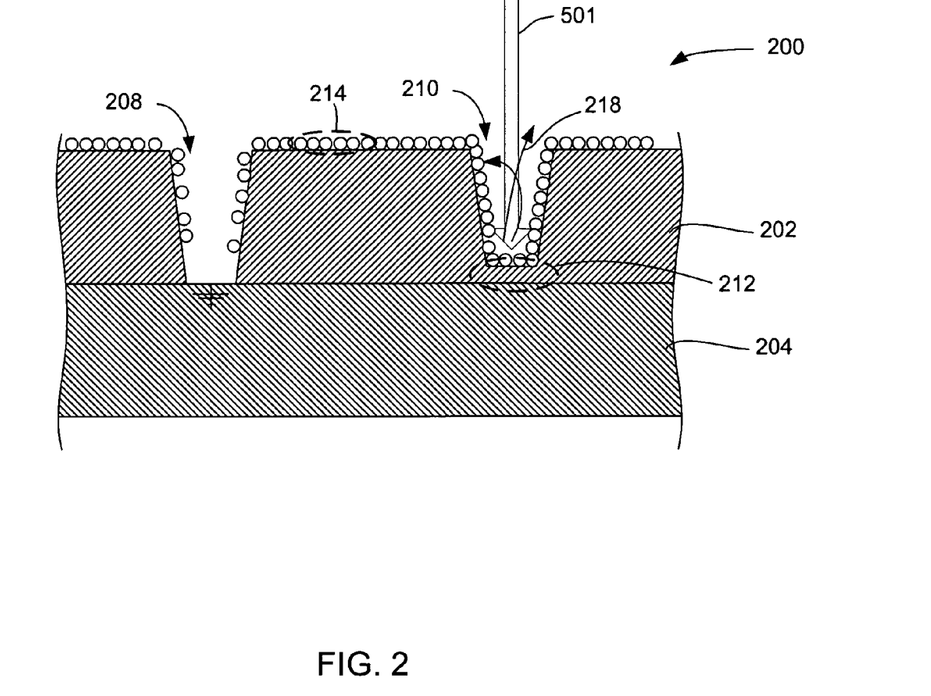
FIG. 2 illustrates a diagrammatic, cross-sectional view of a portion of a semiconductor wafer.
Figure 3:
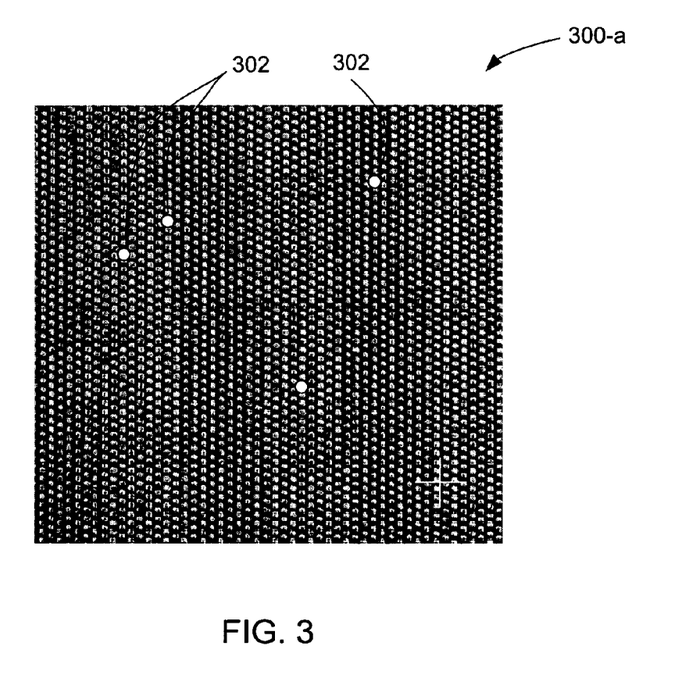
FIG. 3 represents a graphical representation of a top plan view of a portion of the semiconductor wafer of FIG. 2.
Figure 4:
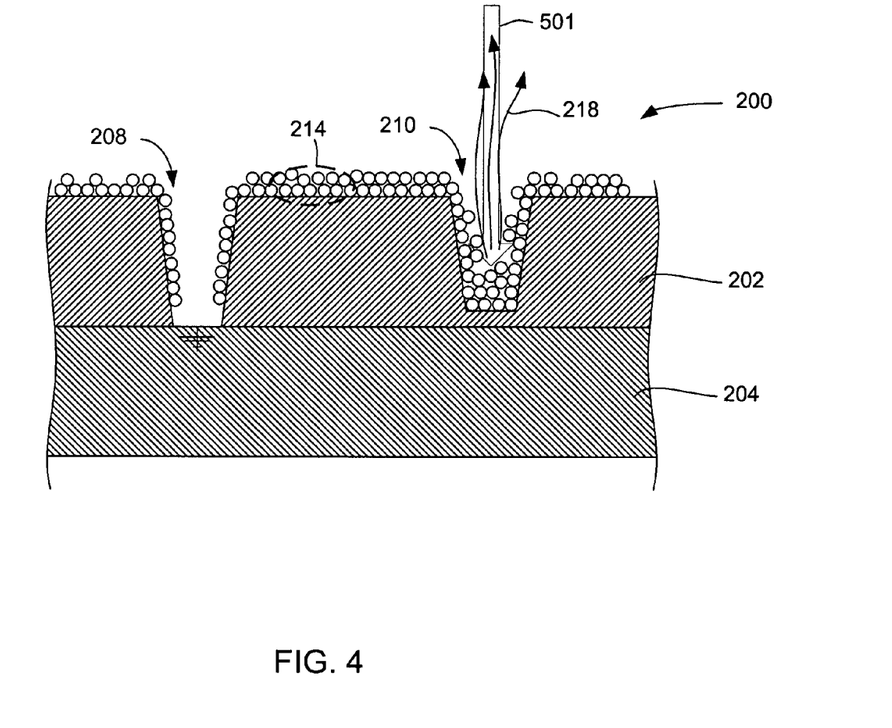
FIG. 4 illustrates the semiconductor specimen of FIGS. 2 and 3 after being flooded with electrons by one or more flood guns.
Figure 5:
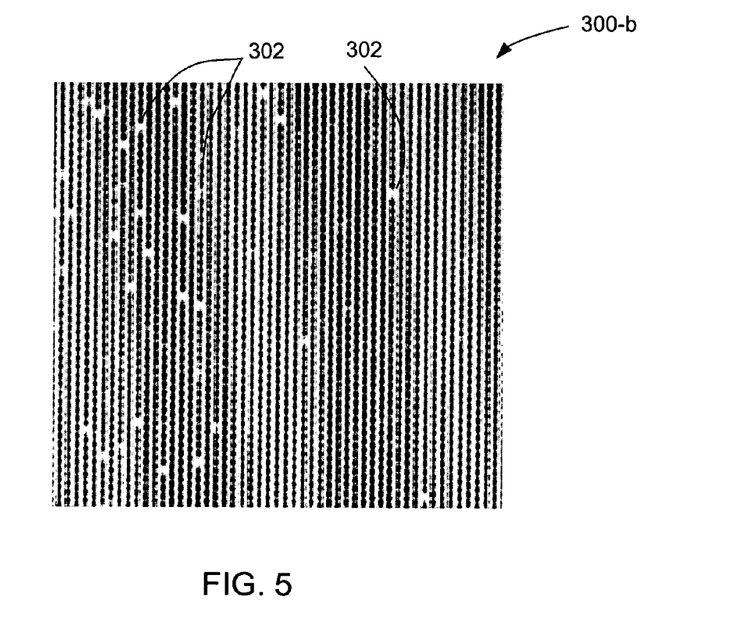
FIG. 5 represents a graphical representation of a top plan view of the same portion of semiconductor wafer of FIG. 4 after flood guns have applied electrons.
Figure 6:
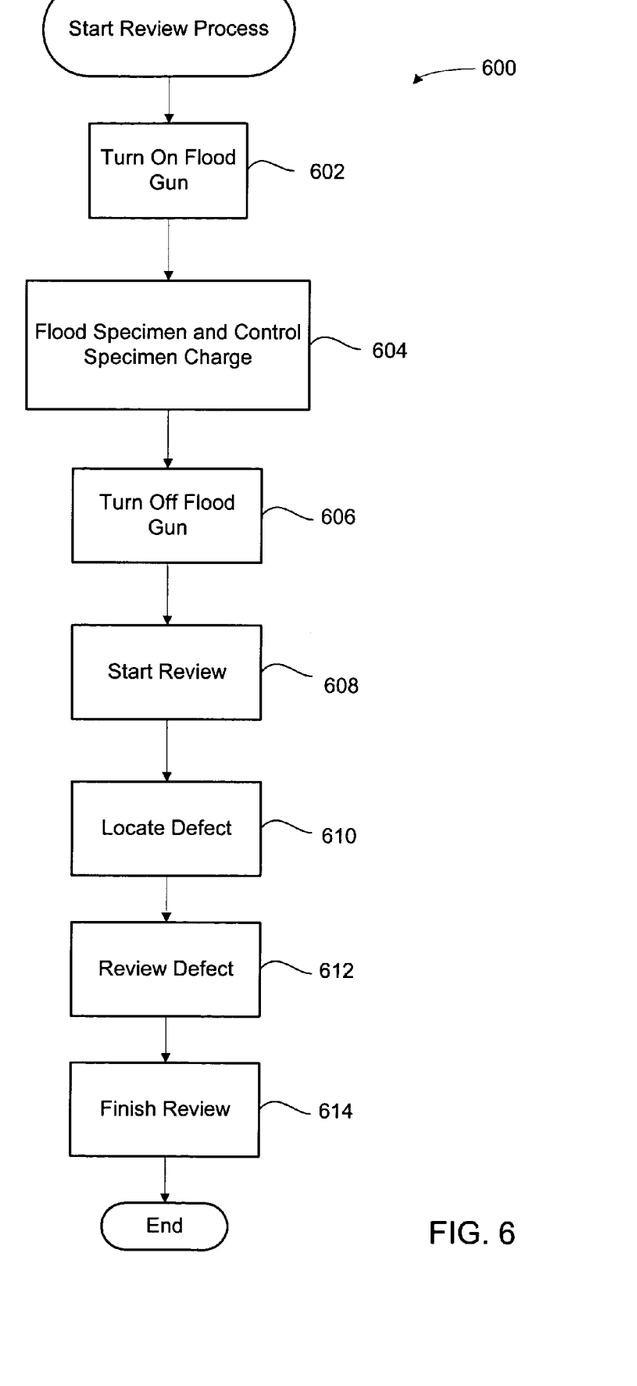
FIG. 6 illustrates a flow diagram that describes the voltage contrast defect review process according to one embodiment of the present invention.

FIGS. 2–5 present diagrams of a semiconductor specimen in order to describe how the techniques of the present invention enable a review system to more effectively review voltage contrast defects. FIGS. 2 and 3 correspond to a semiconductor specimen before being charged with electron flood guns. FIGS. 4 and 5 correspond to the same semiconductor specimen after being negatively charged with electron flood guns. FIG. 6 is a flow diagram representing a process for applying a negative or a positive charge to specimen 200. FIG. 6 will first be described with respect to FIGS. 2–5 to explain the process for applying a negative charge to specimen 200. Afterwards, FIG. 6 is described with respect to the process for applying a positive charge to specimen 200.

Now, turning to FIG. 2 specifically, FIG. 2 illustrates a diagrammatic, cross-sectional view of a portion of a semiconductor wafer 200. Wafer 200 has multiple layers 202 and 204 such that layer 202 is a dielectric layer and layer 204 is a silicon substrate. Dielectric layer 202 has a fully formed contact 208 that provides a clear opening to the top surface of substrate 204. Dielectric layer 202 also has a partially formed contact 210 that does not completely lead to the top surface of substrate 204. Contact 210 is an "under-etched" contact and is considered a defect because it would fail to provide a electrical path between substrate 204 and another conductive layer to be formed on top of dielectric layer 202. Portion 212 is a region of dielectric material that should have been etched away when contacts 208 and 210 were formed through etching processes.

The small circles on the surface of dielectric layer 202 represent negatively charged particles or electrons 214. Electrons 214 are deposited onto wafer 200 when an electron beam 501 from a scanning electron microscope is scanned across the surface of wafer 200. Areas near the bottom of contact 208 are less negatively charged since the bottom of contact 208 is electrically conductive layer 204, which acts as an electrical ground. The remaining surface area of dielectric layer 202 becomes negatively charged. As electron beam 501 impinges wafer 200, high energy electrons such as secondary electrons escape from the surface of wafer 200. Escaping electrons are represented by directional lines 218. Few electrons tend to escape from contact 208 since contact 208 is not negatively charged and therefore does not give electrons a boost (through repelling forces) needed to escape. Defective contact 210 is more negatively charged and therefore provides additional boost for electrons to escape. Contact 210 has more secondary electrons 218 escaping and reaching an electron detector than contact 208. Escaping electrons 218 from contact 210 manifest in a review system image as a defect. For instance, in a graphical representation, defective contact 210 would show up as a bright spot.

Unfortunately, since typical review SEMs use low electron beam current, the required charge difference for voltage contrast manifestation is not sufficiently established. This is especially true for high aspect ratio contacts or vias. High aspect ratio contacts or vias are those that have a large height and a relatively small diameter. Lower energy electrons have difficulty escaping from these narrow and tall contacts because they tend to collide into the walls of the contacts before they escape. For example, one of electrons 218 is shown to crash into the wall of contact 210.

FIG. 3 represents a graphical representation 300-a of a top plan view of a portion of semiconductor wafer 200 of FIG. 2. Dark areas represent defect free zones and light areas 302 represent defects. Few light areas (defects) 302 are shown in FIG. 3 because voltage contrast defects are difficult to detect when using conventional review SEM systems.

In contrast, FIGS. 4 and 5 will be described later to show how flooding a semiconductor specimen with electrons can assist a review system to detect and review many more voltage contrast defects that do not show up otherwise. But first, FIG. 6 will describe the process for applying a negative charge to a semiconductor wafer in order to detect and review voltage contrast defects that do not manifest otherwise.

FIG. 6 illustrates a flow diagram 600 that describes the voltage contrast defect review process according to one embodiment of the present invention. In one implementation, review process 600 can be performed to review the entire semiconductor wafer. In another implementation, review process 600 can be repeated so that separate sub-regions of a specimen are reviewed.

With respect to FIGS. 4 and 5, review process 600 begins at operation 602 when one or more flood guns are turned on. Then at operation 604, the flood guns direct electron beams towards the semiconductor specimen to negatively charge the surface of wafer 200. The amount of negative charge applied to the surface of specimen 200 depends in part upon the feature characteristics within the specimen. For example, when the features such as contacts and vias of the specimen have high aspect ratios, more negative charge is required for a review SEM system to detect the voltage contrast defects for review. The optimal amount of charge to apply to a specimen depends upon the specific parameters of the review system and the wafer that is being examined. Note that best review results are not always obtained by simply applying a maximum possible amount of negative charge to the specimen. During the flooding process, beam energy, emission current, stage bias or specimen charge electrode are adjusted to produce the desired surface charge on the specimen.

During the flooding process, the specimen charge electrode 530 or the specimen stage 526 can optionally be used to control the charge level on specimen 200. Specimen charge electrode 530 is utilized by maintaining electrode 530 at a certain bias level. On the other hand, specimen stage 526 can be used to regulate the charge on specimen 200 by maintaining the bias of specimen stage 526 at a certain level. As described above, the bias of specimen charge electrode 530 or the specimen stage 526 can be adjusted so that the specimen is left with either a negative or a positive charge. Flood guns 528 can be turned off at operation 606 when the desired charge is applied to specimen 200. If necessary, the flooding operations can be repeated if it is determined that insufficient charge has been applied to the surface of the specimen.

FIG. 4 illustrates semiconductor specimen 200 after being flooded with electrons by flood guns 528. Optionally, specimen charge electrode 530 can be negatively biased or stage 526 can be positively biased to obtain a negative charge on the surface of the specimen. If so desired, specimen charge electrode 530 can be positively biased or stage 526 can be negatively biased to obtain a positive charge on the surface of the specimen.

In FIG. 4, the surface of dielectric layer 202 is more heavily charged with electrons 214 in comparison with FIG. 2. However the bottom of contact 208 remains free of negative charged because substrate 204 acts as an electrical ground. Since defective contact 210 is much more negatively charged with electrons 214, it boosts the energy of the secondary electrons emitted during interactions between electron beam 501 from the review SEM system 500 and specimen 200 to have sufficient energy to escape from contact 210. Electrons 214 within contact 210 provide a repelling force that boosts escaping electrons 218 such that they are more likely to escape from contact 210. Flood guns 528 should apply a heavier charge (i.e., more electrons 214) for high aspect ratio contacts since it is more difficult for electrons to escape from tall and narrow contacts and vias. On the other hand, when the aspect ratios of contacts and vias are smaller, less charge is required from flood guns 528.

At operation 608, the electron beam of the review system 500 is turned on. Then in operation 610, review system 500 begins to scan over the semiconductor wafer or a sub-region of the wafer. Since the surface of specimen 200 is highly charged with electrons, the relatively low current electron beam of review system 500 is able to cause voltage contrast defects to manifest. This means that review system 500 has a greater ability to detect, locate and review voltage contrast defects that would not appear otherwise. FIG. 5 represents a graphical representation 300-b of a top plan view of the same portion of semiconductor wafer 200 after flood guns 528 have applied a negative charge. FIG. 5 graphically shows the defects a review system detects from the surface of specimen 200. Again, dark areas represent defect free zones and light areas 302 represent defects. In contrast to FIG. 3, FIG. 5 contains many light areas (defects) 302 that do not appear otherwise because of the electron gun flooding process.

In operation 612, review system 500 reviews all or some of the defects to gain detailed information about each defect. Techniques such as EDX and FIB cross-sectioning can be used to obtain information about each defect such as defect size, shape, composition, type (e.g., scratch, foreign particle, etc.), and cause. After the review operation is finished, the review system electron beam is turned off in operation 614.

The process 600 can go in different directions after operation 612. In a first situation, review process 600 can end. In this first situation the process could involve flooding of the entire surface of specimen 200 and then reviewing the entire surface of specimen 200. In a second situation, all of the operations of process 600 can be repeated so that another portion of specimen 200 can be reviewed. In this second situation, the first execution of process 600 could have been for the review of a first sub-region of specimen 200. Process 600 could be repeated until a certain number of sub-regions have been completely reviewed or the entire surface of specimen 200 has been reviewed. In each iteration of process 600, each sub-region can be flooded and reviewed individually.

As mentioned earlier, the process described in FIG. 6 can also be implemented to apply a positive charge onto a specimen. This is performed by biasing the specimen charge electrode positively or by biasing the stage negatively during operation 604. This causes electrons to escape from the specimen thereby leaving the specimen with a positive charge. The review process of operations 608–614 are then configured to detect voltage contrast defects on a positively charged specimen.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

I claim:

1. A method for reviewing voltage contrast defects on a semiconductor specimen comprising:
   turning on an electron flood gun;
   applying a surface charge to a semiconductor specimen by using the flood gun;
   turning off the electron flood gun;
   using an electron beam generator to direct an electron beam upon the surface of the specimen, wherein the electron beam secondary electrons to emanate from the specimen, wherein the electron beam generator produces an electron beam having a current level approximately within the range of 10–50 pico Amps;
   detecting the secondary electrons in order to locate voltage contrast defects; and
   reviewing the located voltage contrast defects.

2. A method as recited in claim 1 wherein the surface charge is applied to the entire surface of the specimen.

3. A method as recited in claim 1 wherein the surface has a negative or positive charge.

4. A method as recited in claim 1 wherein the operations of claim 1 are repeated such that during each iteration, voltage contrast defects in a new sub-region are detected and reviewed.

5. A method as recited in claim 1 further comprising:
   reapplying a surface charge to the semiconductor specimen using the flood gun when the charge on the specimen is determined to be insufficient for voltage contrast effects to manifest.

6. A method as recited in claim 1 further comprising:
   positioning a specimen charge electrode above the semiconductor specimen; and
   while the flood gun is turned on, biasing the specimen charge electrode at a certain voltage level in order to obtain a desired charge amount on the semiconductor specimen.

7. A method as recited in claim 6 wherein the specimen charge electrode is negatively biased whereby a negative charge is applied to the semiconductor specimen.

8. A method as recited in claim 6 wherein the specimen charge electrode is positively biased whereby a positive charge is applied to the semiconductor specimen.

9. A method as recited in claim 1 further comprising:
   supporting the semiconductor specimen with a specimen stage, wherein the semiconductor specimen and the seen stage are in electrical contact; and
   biasing the specimen stage at a certain voltage level tin order to obtain a desired surface charge amount on the semiconductor specimen.

10. A method as recited in claim 9 wherein the specimen stage is positively biased whereby a negative charge is applied to the semiconductor specimen.

11. A method as recited in claim 9 wherein the specimen stage is negatively biased whereby a positive charge is applied to the semiconductor specimen.

12. A method as recited in claim 1 wherein the operation of reviewing the located voltage contrast defect involves energy dispersive x-ray analysis techniques or cross-sectioning tools.

13. A method as recited in claim 1 further comprising:
    detecting voltage contrast defects within features on the semiconductor specimen that have high aspect ratios.

14. A method as recited in claim 1 wherein a scanning electron microscope inspection system is used for review.

15. A method as recited in claim 1 wherein the electron beam has a spot size in the range of approximately 2–20 nm.

16. A method as recited in claim 1 wherein the electron flood gun has a spot size in the range of approximately 1–2 cm and has a current level of approximately 0–10 milli Amps.

* * * * *

UNITED STATES PATENT AND TRADEMARK OFFICE
CERTIFICATE OF CORRECTION

| | | |
|---|---|---|
| PATENT NO. | : 7,132,301 B1 | Page 1 of 1 |
| APPLICATION NO. | : 10/600500 | |
| DATED | : November 7, 2006 | |
| INVENTOR(S) | : Frank Y.H. Fan | |

It is certified that error appears in the above-identified patent and that said Letters Patent is hereby corrected as shown below:

In line 9 of claim 1 (column 9, line 11) add --causes-- after "beam".

In line 4 of claim 9 (column 10, line 10) change "seen" to --specimen--.

In line 5 of claim 9 (column 10, line 11) change "level tin" to --level in--.

Signed and Sealed this

Thirty-first Day of July, 2007

JON W. DUDAS
*Director of the United States Patent and Trademark Office*